(12) United States Patent
Beppu

(10) Patent No.: US 11,539,363 B2
(45) Date of Patent: Dec. 27, 2022

(54) CIRCUIT DEVICE, OSCILLATOR, ELECTRONIC APPARATUS, AND VEHICLE

(71) Applicant: Seiko Epson Corporation, Toyko (JP)

(72) Inventor: Kohei Beppu, Minowa (JP)

(73) Assignee: SEIKO EPSON CORPORATION

( * ) Notice: Subject to any disclaimer, the term of this patent is extended or adjusted under 35 U.S.C. 154(b) by 23 days.

(21) Appl. No.: 17/342,729

(22) Filed: Jun. 9, 2021

(65) Prior Publication Data

US 2021/0391859 A1    Dec. 16, 2021

(30) Foreign Application Priority Data

Jun. 10, 2020  (JP) .............................. JP2020-100716

(51) Int. Cl.
| | |
|---|---|
| *H03K 17/687* | (2006.01) |
| *G06F 1/04* | (2006.01) |
| *H03B 5/36* | (2006.01) |
| *H03B 5/32* | (2006.01) |

(52) U.S. Cl.
CPC .......... *H03K 17/6872* (2013.01); *G06F 1/04* (2013.01); *H03B 5/32* (2013.01); *H03B 5/364* (2013.01); *H03K 17/6874* (2013.01); *H03B 2200/0034* (2013.01)

(58) Field of Classification Search
CPC .......... H03K 17/6872; H03K 17/6871; H03K 17/687; H03K 19/00361; H03K 19/018521; H03K 19/018571; H03K 19/018585; H03B 2200/0034
See application file for complete search history.

(56) References Cited

U.S. PATENT DOCUMENTS

| | | | | |
|---|---|---|---|---|
| 5,073,726 | A * | 12/1991 | Kato | ................ H03K 19/00384 326/24 |
| 6,320,407 | B1 * | 11/2001 | Sakamoto | ...... H03K 19/018585 326/27 |
| 2011/0260756 | A1 * | 10/2011 | Agut | ................... H03K 19/0013 327/81 |
| 2012/0161850 | A1 * | 6/2012 | Rangarajan | ............ H03K 19/20 327/427 |
| 2019/0334519 | A1 | 10/2019 | Sawada | |

FOREIGN PATENT DOCUMENTS

JP          2019-193122 A      10/2019

* cited by examiner

*Primary Examiner* — Ryan Johnson
(74) *Attorney, Agent, or Firm* — Harness, Dickey & Pierce, P.L.C.

(57) ABSTRACT

The circuit device includes a first MOS transistor of a first conductivity type a source of which is coupled to a first power supply voltage node, a second MOS transistor of a second conductivity type a source of which is coupled to a second power supply voltage node, a first variable resistance circuit which is coupled between a drain of the first MOS transistor and an output node, and which includes a first switch, and a second switch coupled between the drain of the first MOS transistor and the second power supply voltage node. The control circuit performs control of making the first switch OFF and making the second switch ON when the clock signal fails to be output from the output node, and making the first switch ON and making the second switch OFF when the clock signal is output from the output node.

10 Claims, 9 Drawing Sheets

CIRCUIT DEVICE, OSCILLATOR, ELECTRONIC APPARATUS, AND VEHICLE

The present application is based on, and claims priority from JP Application Serial Number 2020-100716, filed Jun. 10, 2020, the disclosure of which is hereby incorporated by reference herein in its entirety.

BACKGROUND

1. Technical Field

The present disclosure relates to a circuit device, an oscillator, an electronic apparatus and a vehicle each equipped with the oscillator.

2. Related Art

In, for example, JP-A-2019-193122 (Document 1), there is described an oscillator provided with an output buffer circuit which has a P-type transistor and an N-type transistor, and is capable of easily adjusting a rising time and a falling time of an output signal by disposing a variable resistance circuit between output nodes.

However, in the configuration described in Document 1, a transistor which functions as a switch is set to an OFF state in a high-impedance state in which the output signal is not output. Therefore, a charge is accumulated in a node of a drain of the P-type transistor or the N-type transistor which has become in a floating state, and there is a possibility of generating a minute pulse signal when output of the signal is started. Therefore, there is a problem that there is a possibility that it is unachievable to output a signal having a desired waveform when starting the output.

SUMMARY

A circuit device according to the present disclosure includes an output buffer circuit which is coupled between a first power supply voltage node and a second power supply voltage node, and which is configured to output a clock signal from an output node, and a control circuit configured to control an operation of the output buffer circuit, wherein the output buffer circuit includes a first MOS transistor of a first conductivity type a source of which is coupled to the first power supply voltage node, a second MOS transistor of a second conductivity type a source of which is coupled to the second power supply voltage node, a first variable resistance circuit which is coupled between a drain of the first MOS transistor and the output node, and which includes a first switch, and a second switch coupled between the drain of the first MOS transistor and the second power supply voltage node, and the control circuit performs control of making the first switch OFF and making the second switch ON when the clock signal fails to be output from the output node, and making the first switch ON and making the second switch OFF when the clock signal is output from the output node.

Further, an oscillator according to the present disclosure includes the circuit device described above, and a resonator configured to generate an oscillation signal, wherein the circuit device outputs a clock signal based on the oscillation signal.

Further, an electronic apparatus according to the present disclosure includes the oscillator described above.

Further, a vehicle according to the present disclosure includes the oscillator described above.

DESCRIPTION OF EXEMPLARY EMBODIMENTS

Embodiment 1

* Basic Block Configuration of Output Buffer Circuit and Circuit Device *

Figure 1:
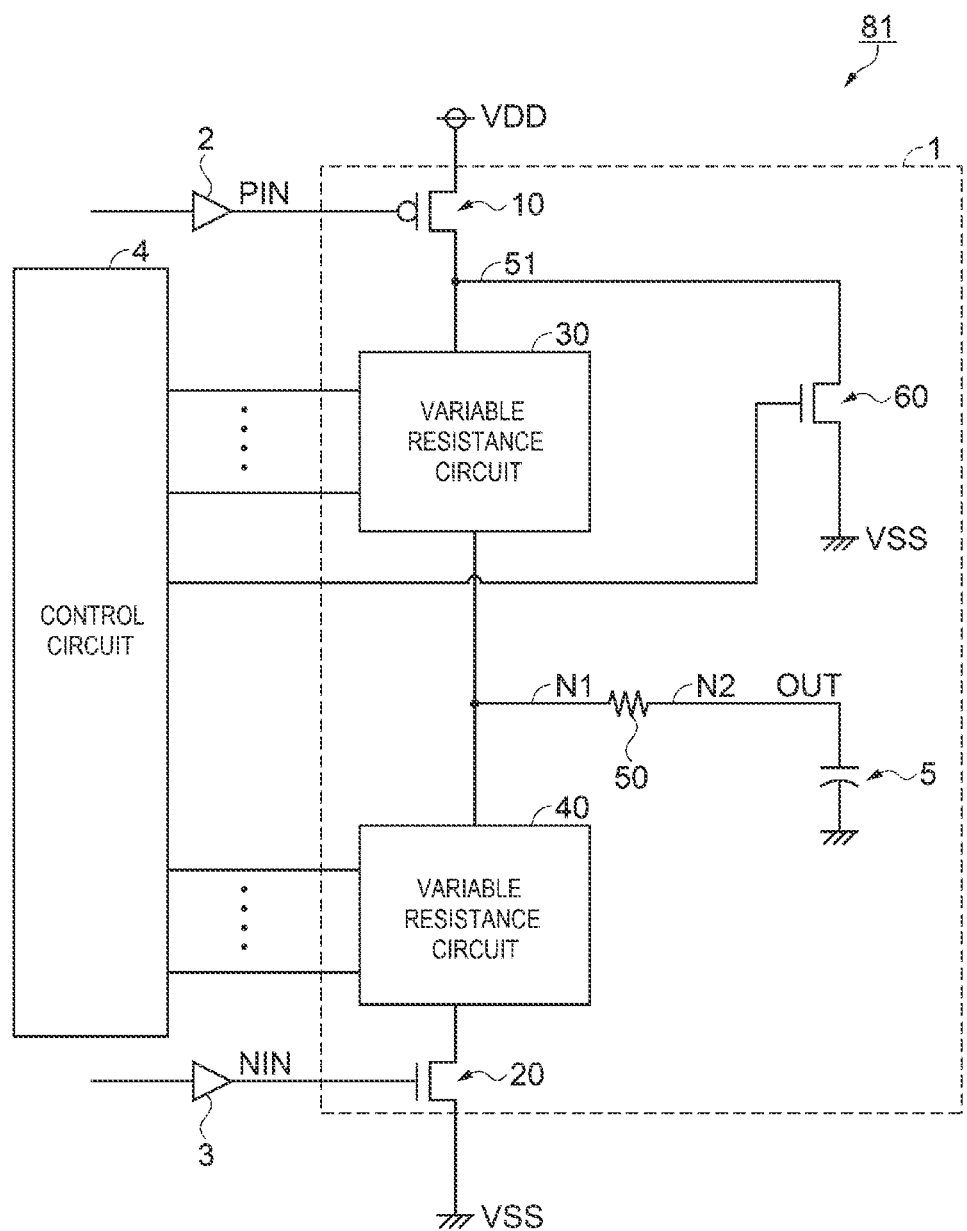
FIG. 1 is a basic block configuration diagram of an output buffer circuit and a circuit device according to Embodiment 1.

FIG. 1 is a basic block configuration diagram of an output buffer circuit and a circuit device according to the present embodiment.

As shown in FIG. 1, the circuit device 81 according to the present embodiment is constituted by the output buffer circuit 1, a control circuit 4, and so on.

The output buffer circuit 1 is provided with a P-type transistor 10 as a p-channel MOSFET (Metal Oxide Semiconductor Field Effect Transistor), an N-type transistor 20 as an N-channel MOSFET, an N-type switch 60, two variable resistance circuits 30, 40, and a resistor 50.

The control circuit 4 is a control circuit for controlling an operation of the output buffer circuit 1. It should be noted that in an actual oscillation device, the control circuit 4 is not a dedicated circuit for the output buffer circuit 1, but a part for controlling the output buffer circuit 1 out of a function of a control circuit 260 of an oscillator 200 including the output buffer circuit 1 described later is clipped as the control circuit 4, and is shown in the block diagram.

In the P-type transistor 10, the source is supplied with a power supply voltage VDD, and the gate is supplied with an input signal PIN from a pre-buffer circuit 2. When the input signal PIN is at a low level, in the P-type transistor 10, the source and the drain become in a conductive state, and the drain reaches a voltage substantially equal to the power supply voltage VDD. Further, when the input signal PIN is at a high level, in the P-type transistor 10, the source and the drain become in a nonconductive state, and the drain becomes in a high-impedance state.

In the N-type transistor 20, the source is supplied with a ground voltage VSS, and the gate is supplied with an input signal NIN from a pre-buffer circuit 3. When the input signal NIN is at the high level, in the N-type transistor 20, the source and the drain become in the conductive state, and the drain reaches a voltage substantially equal to the ground voltage VSS. Further, when the input signal NIN is at the low level, in the N-type transistor 20, the source and the drain become in the nonconductive state, and the drain becomes in the high-impedance state.

The control circuit 4 is a control circuit including a CPU (Central Processing Unit), and a logic circuit constituted by transistors. The control circuit 4 generates a control signal for controlling ON/OFF of the variable resistance circuits 30, 40, the N-type switch 60, and so on. It is possible to perform control of resistance values of the variable resistance circuits 30, 40, presence or absence of output of the output signal OUT, and so on using the control signal.

The variable resistance circuit 30 is disposed in a signal path between the drain of the P-type transistor 10 and an output node N2 of the output buffer circuit 1. Specifically, the variable resistance circuit 30 is electrically coupled between the drain of the P-type transistor 10 and an internal node N1 of the output buffer circuit 1. The variable resistance circuit 30 varies in resistance value in accordance with the control signal supplied from the control circuit 4.

The variable resistance circuit 40 is disposed in a signal path between the drain of the N-type transistor 20 and the output node N2. Specifically, the variable resistance circuit 40 is electrically coupled between the drain of the N-type transistor 20 and the internal node N1. The variable resistance circuit 40 varies in resistance value in accordance with the control signal supplied from the control circuit 4.

The resistor 50 is electrically coupled between the internal node N1 and the output node N2.

A load capacitance 5 is a gate capacitance, a parasitic capacitance, and so on of a circuit in a posterior stage to be coupled to the output node N2 of the output buffer circuit 1. When fixing the resistance value of the variable resistance circuit 30 and the resistance value of the variable resistance circuit 40, the higher the load capacitance 5 is, the longer the rising time and the falling time of the output signal OUT of the output buffer circuit 1 become. It should be noted that the rising time of the output signal OUT means the time necessary for the voltage of the output signal OUT to rise, for example, from 10% to 90% of a difference between the power supply voltage VDD and the ground voltage VSS. Further, the falling time of the output signal OUT means the time necessary for the voltage of the output signal OUT to fall, for example, from 90% to 10% of the difference between the power supply voltage VDD and the ground voltage VSS. It should be noted that the output signal OUT is also referred to as a clock signal.

Here, there is a problem that an unwanted charge is accumulated at the node 51 between the P-type transistor 10 and the variable resistance circuit 30. Although the details of the problem will be described later, the output buffer circuit 1 according to the present embodiment is provided with an N-type switch 60 in order to solve the problem.

The N-type switch 60 is an N-channel MOSFET, wherein the drain is coupled to the node 51, the source is supplied with the ground voltage VSS, and the gate is supplied with the control signal from the control circuit 4.

When the output signal OUT is kept output from the output node N2, a signal at the low level is input to the gate of the N-type switch 60 from the control circuit 4, and the node 51 at the drain side and the ground voltage at the source side become in the nonconductive state. When the output signal OUT is in a halt state, a signal at the high level is input to the gate of the N-type switch 60 from the control circuit 4, and the node 51 at the drain side and the ground voltage at the source side become in the conductive state. This is for setting the node 51 to the ground voltage when the output signal OUT is in the halt state to thereby preventing the unwanted charge from being accumulated at the node 51.

\*\*\* Problem in Output Buffer Circuit and Circuit Device in Comparative Example \*\*\*

Figure 2:
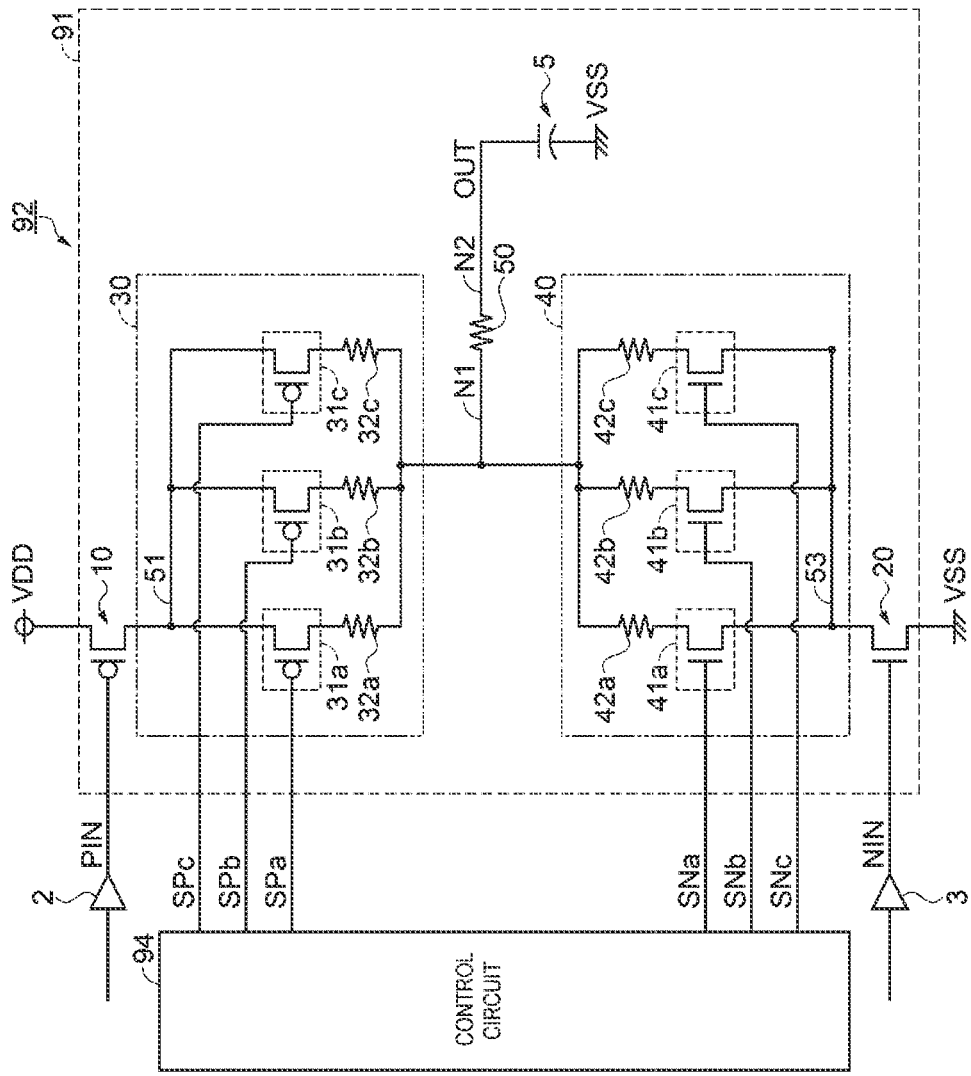
FIG. 2 is a circuit diagram of an output buffer circuit and a circuit device in a comparative example.

FIG. 2 is a circuit configuration diagram of an output buffer circuit and a circuit device in a comparative example.

The circuit device 92 shown in FIG. 2 has a related-art circuit configuration, and is constituted by an output buffer circuit 91, a control circuit 94, and so on.

In the output buffer circuit 91 shown in FIG. 2, there is shown a specific circuit configuration of the variable resistance circuits 30, 40. It should be noted that the same regions as in the configuration shown in FIG. 1 are denoted by the same reference numbers, and redundant descriptions will be omitted.

The output buffer circuit 91 is provided with the P-type transistor 10, the N-type transistor 20, the two variable resistance circuits 30, 40, the resistor 50, and so on.

The variable resistance circuit 30 includes three switches 31a, 31b, and 31c each formed of a P-type transistor, and three resistors 32a, 32b, and 32c. It should be noted that although there is adopted a three-stage variable resistance configuration in order to make the description easy, it is sufficient to adopt a multi-stage setting in accordance with a necessary variable resistance range. For example, it is possible to adopt a five-stage configuration provided with five switches, or a ten-stage configuration.

Similarly, the variable resistance circuit 40 is constituted by three switches 41a, 41b, and 41c each formed of an N-type transistor, and three resistors 42a, 42b, and 42c.

Then, a circuit operation of the variable resistance circuit 30 will be described. It should be noted that the control circuit 94 is a related-art control circuit.

The switch 31a makes ON/OFF in accordance with a control signal SPa supplied from the control circuit 94. The gate of the switch 31a is coupled to the control circuit 94, and is supplied with the control signal SPa from the control circuit 94. The source of the switch 31a is coupled to the node 51, and the drain is coupled to one end of the resistor 32a. The other end of the resistor 32a is coupled to the internal node N1.

When the switch 31a closes, the drain of the P-type transistor 10 and the one end of the resistor 32a are electrically coupled to each other, and when the switch 31a opens, the drain of the P-type transistor 10 and the one end of the resistor 32a are electrically blocked.

The switch 31b makes ON/OFF in accordance with a control signal SPb supplied from the control circuit 94. The gate of the switch 31b is coupled to the control circuit 94, and is supplied with the control signal SPb from the control circuit 94. The source of the switch 31b is coupled to the node 51, and the drain is coupled to one end of the resistor 32b. The other end of the resistor 32b is coupled to the internal node N1. When the switch 31b closes, the drain of the P-type transistor 10 and the one end of the resistor 32b are electrically coupled to each other, and when the switch 31b opens, the drain of the P-type transistor 10 and the one end of the resistor 32b are electrically blocked.

The switch 31c makes ON/OFF in accordance with a control signal SPc supplied from the control circuit 94. The gate of the switch 31c is coupled to the control circuit 94, and is supplied with the control signal SPc from the control circuit 94. The source of the switch 31c is coupled to the node 51, and the drain is coupled to one end of the resistor 32c. The other end of the resistor 32c is coupled to the internal node N1.

When the switch 31c closes, the drain of the P-type transistor 10 and the one end of the resistor 32c are electrically coupled to each other, and when the switch 31c opens, the drain of the P-type transistor 10 and the one end of the resistor 32c are electrically blocked.

The variable resistance circuit 30 configured in such a manner varies in resistance value in accordance with logic levels of the control signals SPa, SPb, and SPc supplied from the control circuit 94. Further, the higher the resistance value of the variable resistance circuit 30 is, the gentler the rise of the waveform of the output signal OUT becomes. Further, the lower the resistance value of the variable resistance circuit 30 is, the steeper the rise of the waveform of the output signal OUT becomes.

Then, a circuit operation of the variable resistance circuit 40 will be described.

The switch 41a makes ON/OFF in accordance with a control signal SNa supplied from the control circuit 94. The gate of the switch 41a is coupled to the control circuit 94, and is supplied with the control signal SNa from the control circuit 94. The source of the switch 41a is coupled to a node 53 at the drain end of the N-type transistor 20. The drain of the switch 41a is coupled to one end of the resistor 42a. The other end of the resistor 42a is coupled to the internal node N1.

When the switch 41a closes, the drain of the N-type transistor 20 and the one end of the resistor 42a are electrically coupled to each other, and when the switch 41a opens, the drain of the N-type transistor 20 and the one end of the resistor 42a are electrically blocked.

The switch 41b makes ON/OFF in accordance with a control signal SNb supplied from the control circuit 94. The gate of the switch 41b is coupled to the control circuit 94, and is supplied with the control signal SNb from the control circuit 94. The source of the switch 41b is coupled to the node 53, and the drain is coupled to one end of the resistor 42b. The other end of the resistor 42b is coupled to the internal node N1.

When the switch 41b closes, the drain of the N-type transistor 20 and the one end of the resistor 42b are electrically coupled to each other, and when the switch 41b opens, the drain of the N-type transistor 20 and the one end of the resistor 42b are electrically blocked.

The switch 41c makes ON/OFF in accordance with a control signal SNc supplied from the control circuit 94. The gate of the switch 41c is coupled to the control circuit 94, and is supplied with the control signal SNc from the control circuit 94. The source of the switch 41c is coupled to the node 53, and the drain is coupled to one end of the resistor 42c. The other end of the resistor 42c is coupled to the internal node N1.

When the switch 41c closes, the drain of the N-type transistor 20 and the one end of the resistor 42c are electrically coupled to each other, and when the switch 41c opens, the drain of the N-type transistor 20 and the one end of the resistor 42c are electrically blocked.

The variable resistance circuit 40 configured in such a manner varies in resistance value in accordance with logic levels of the control signals SNa, SNb, and SNc supplied from the control circuit 94 similarly to the variable resistance circuit 30. Further, the higher the resistance value of the variable resistance circuit 40 is, the gentler the fall of the waveform of the output signal OUT becomes. Further, the lower the resistance value of the variable resistance circuit 40 is, the steeper the fall of the waveform of the output signal OUT becomes.

Figure 3:
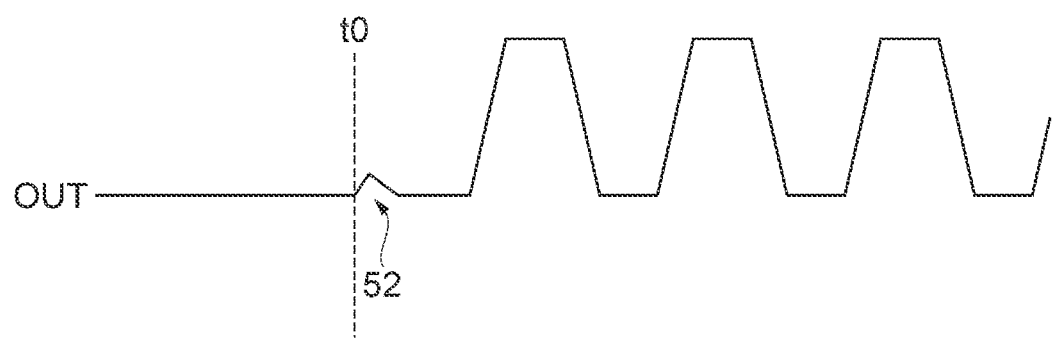
FIG. 3 is a diagram showing an aspect of an output waveform.

FIG. 3 is a diagram showing an output waveform by the related-art output buffer circuit.

In the output buffer circuit 91 of the related-art type shown in FIG. 2, there is a problem that an unwanted noise 52 is generated in the waveform of the output signal OUT at the output start time t0 as shown in FIG. 3. This is because the node 51 forming a junction point between the drain end of the P-type transistor 10 and the source ends of the switches 31a, 31b, and 31c becomes in the electrically floating state to retain a minute charge since the source and drain of each of the switches 31a, 31b, and 31c become in the nonconductive state in addition to the phenomenon that the source and the drain of the P-type transistor 10 become in the nonconductive state in the halt state of the output signal OUT. Thus, at the output start time t0, the unwanted noise 52 is generated. The noise 52 affects the output signal OUT when using the output buffer circuit 91 in the oscillation circuit, and there is a concern that the desired output signal OUT cannot be obtained.

Similarly, there is substantially the same problem at the node 53 at the drain end of the N-type transistor 20. In particular, this is because the node 53 forming a junction point between the drain end of the N-type transistor 20 and the source ends of the switches 41a, 41b, and 41c becomes in the electrically floating state to retain a minute charge since the source and drain of each of the switches 41a, 41b, and 41c become in the nonconductive state in addition to the phenomenon that the source and the drain of the N-type transistor 20 become in the nonconductive state in the halt state of the output signal OUT. When the charge is accumulated in the node 53, there is also the problem that the unwanted noise 52 is generated in the waveform of the output signal OUT at the output start time t0 as shown in FIG. 3.

* Circuit Configuration of Output Buffer Circuit and Circuit Device *

Figure 4:
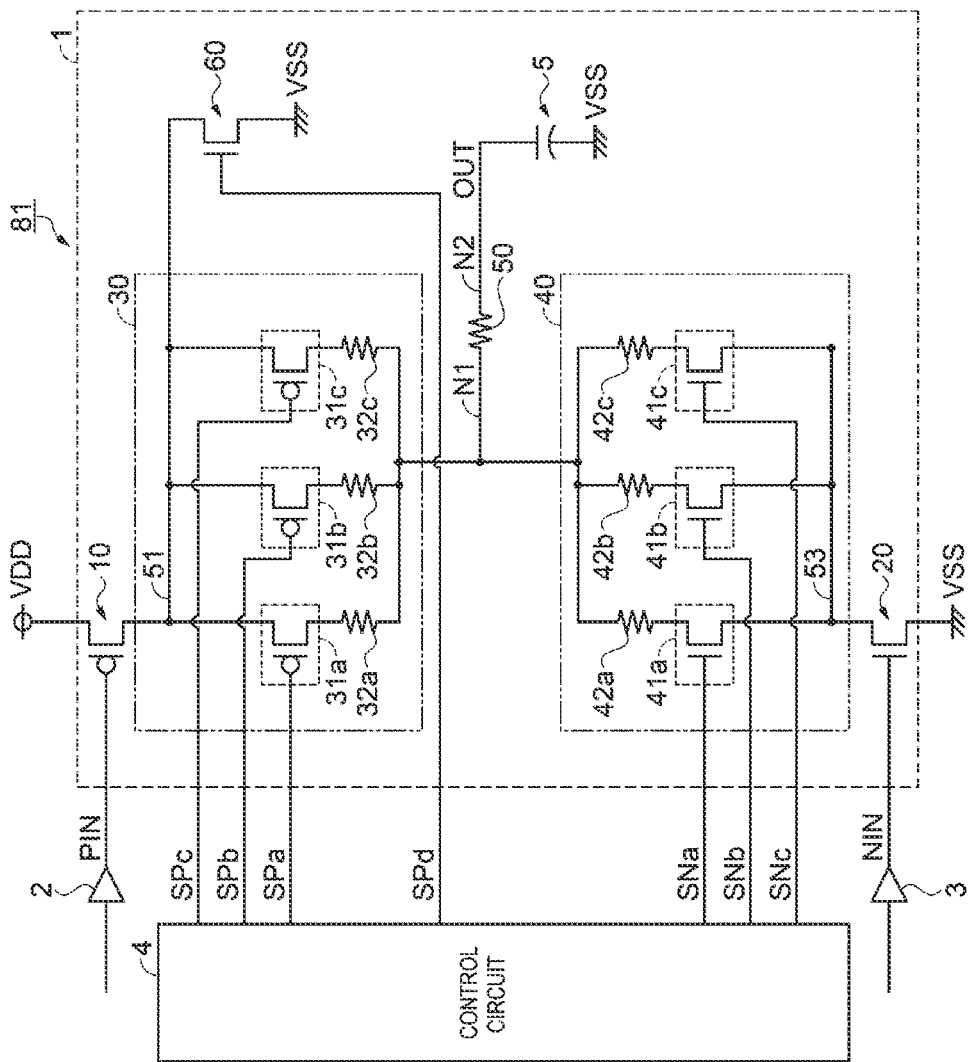
FIG. 4 is a circuit diagram of the output buffer circuit and the circuit device according to Embodiment 1.

FIG. 4 is a circuit configuration diagram of the output buffer circuit and the circuit device according to the present embodiment, and corresponds to FIG. 1.

FIG. 4 is a diagram obtained by modifying the basic blocks in FIG. 1 into specific circuit configurations. In particular, the variable resistance circuits 30, 40 are modified into the specific circuit configurations. It should be noted that the circuit configurations of the variable resistance circuits 30, 40 shown in FIG. 4 are the same as the circuit configurations of the variable resistance circuits 30, 40 shown in FIG. 2.

In the following description, the same regions as in the above description are denoted by the same reference numbers, and the redundant explanations will be omitted.

As described above, the circuit device 81 according to the present embodiment is constituted by the output buffer circuit 1, the control circuit 4, and so on.

The output buffer circuit 1 shown in FIG. 4 is provided with the P-type transistor 10 as a first MOS transistor, the N-type transistor 20 as a second MOS transistor, the N-type switch 60 as a second switch, the variable resistance circuit 30 as a first variable resistance circuit, the variable resistance circuit 40 as a second variable resistance circuit, and the resistor 50. Further, in FIG. 4, there are shown the control circuit 4 for controlling an output circuit, and so on.

The variable resistance circuit 30 is the same in configuration as the variable resistance circuit 30 in FIG. 2, and includes the three switches 31a, 31b, and 31c each formed of the P-type transistor, and the three resistors 32a, 32b, and 32c. It should be noted that the switch 31a corresponds to a first switch. The switches 31b, 31c each correspond to a fifth switch. At least one of the switches 31a, 31b, and 31c makes ON in accordance with the set resistance value.

The resistor 32a corresponds to a first resistor. The resistors 32b, 32c each correspond to a second resistor.

Further, although there is adopted a three-stage variable resistance configuration in order to make the description easy, it is sufficient to adopt a multi-stage setting in accordance with a necessary variable resistance range. For example, it is possible to adopt a five-stage configuration provided with five switches, or a ten-stage configuration.

Similarly, regarding the variable resistance circuit 40, there is adopted the same configuration as that of the variable resistance circuit 40 in FIG. 2 constituted by the three switches 41a, 41b, and 41c, and the three resistors 42a, 42b, and 42c. It should be noted that the switch 41a corresponds to a third switch. The switches 41b, 41c each correspond to a sixth switch. At least one of the switches 41a, 41b, and 41c makes ON in accordance with the set resistance value.

The resistor 42a corresponds to a third resistor. The resistors 42b, 42c each correspond to a fourth resistor.

As described with reference to FIG. 3, the N-type switch 60 is a circuit added for removing generation of the unwanted noise 52 when starting the output which is generated in the related-art output buffer circuit.

Further, the control circuit 4 of the circuit device 81 according to the present embodiment also has a function of controlling the N-type switch 60 in addition to the function of the related-art control circuit 94 (FIG. 2). In particular, the control circuit 4 generates a control signal SPd for controlling ON/OFF of the N-type switch 60, and then supplies the control signal SPd to the N-type switch 60.

In the N-type switch 60, the drain is coupled to the node 51, the source is supplied with the ground voltage VSS as a voltage of a second power supply voltage node, and the gate is supplied with the control signal SPd from the control circuit 4. When the output signal OUT in the output node N2 is in the halt state, the control signal SPd at the high level is input to the gate of the N-type switch 60 from the control circuit 4, and the node 51 at the drain side and the ground voltage at the source side become in the conductive state. This is for dropping the voltage of the node 51, which is in the electrically floating state in the related-art circuit, to the ground voltage to thereby prevent the charge from being retained at the node 51 in the halt state of the output signal OUT. When no charge is retained at the node 51, there is no chance for the unwanted noise to be output when starting the output, and it is possible to obtain a desired clean output waveform. Further, in the state in which the output signal OUT is kept output in the output node N2, since the control signal SPd at the low level is input to the gate of the N-type switch 60 from the control circuit 4, and the node 51 at the drain side and the ground voltage at the source side become in the nonconductive state, there is no possibility that the output of the output signal OUT in the steady state is hindered.

As described hereinabove, according to the circuit device 81 related to the present embodiment, the following advantages can be obtained.

The output buffer circuit 1 is provided with the N-type switch 60 coupled between the drain of the P-type transistor 10 and the ground voltage VSS.

Further, when the clock signal is not output from the output node N2, the control circuit 4 controls all of the switches 31a, 31b, and 31c to make OFF, and at the same time, controls the N-type switch 60 to make ON. When the clock signal is output from the output node N2, the control circuit 4 performs control of making the switch 31a ON, and at the same time, making the N-type switch 60 OFF.

Thus, unlike the related-art output buffer circuit, it is possible to release the charge retained at the node 51 when halting the output, and thus, output the signal having the clean waveform from the beginning of the output.

Therefore, it is possible to provide the output buffer circuit 1 and the circuit device 81 with which the signal having the desired waveform can be obtained from the beginning of the output.

It should be noted that when the clock signal is output from the output node N2, it is sufficient to make at least one of the switches 31a, 31b, and 31c ON in accordance with the set resistance value.

* Different Aspect-1 of Output Buffer Circuit *

Embodiment 2

Figure 5:
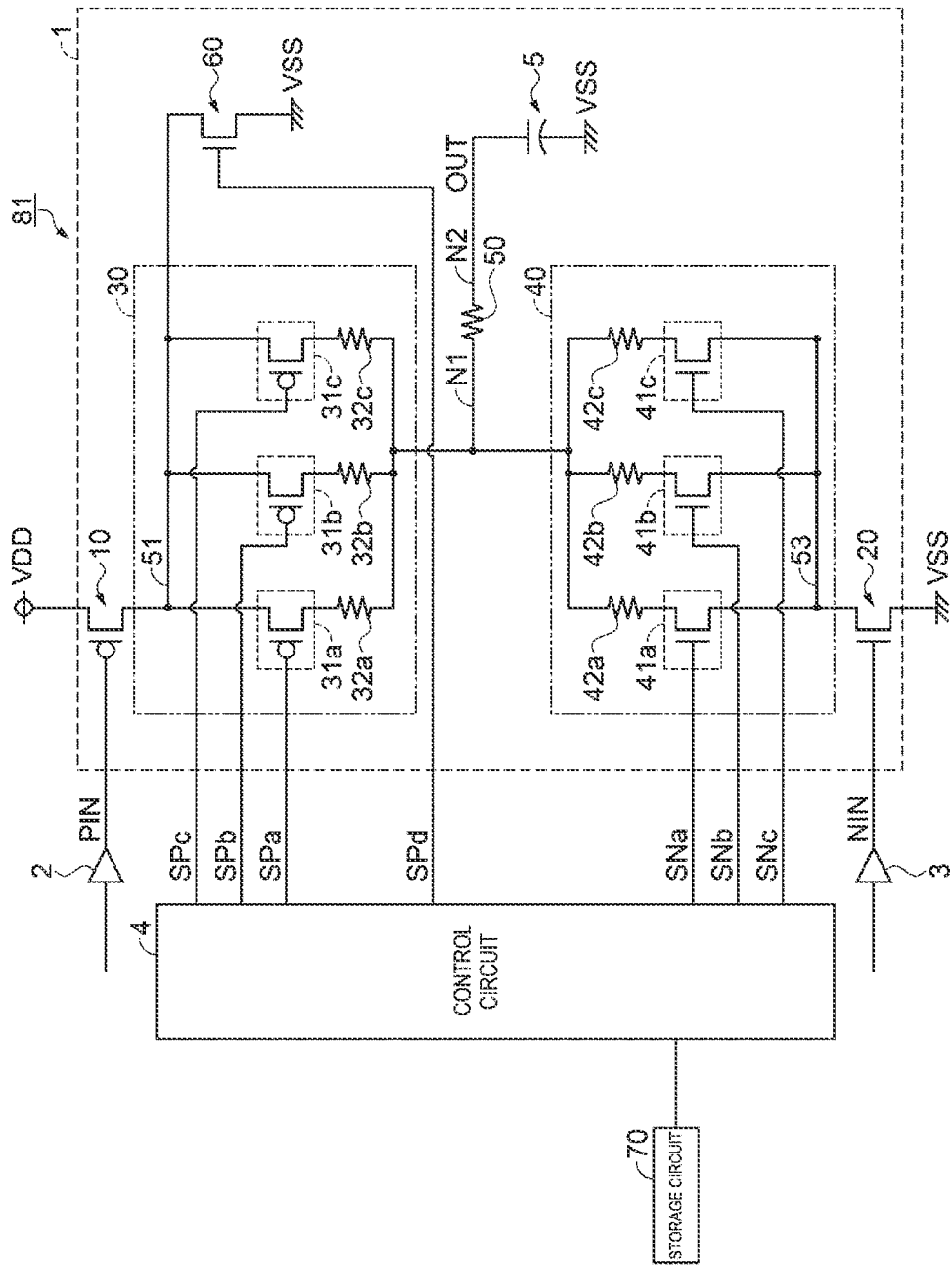
FIG. 5 is a circuit diagram of an output buffer circuit and a circuit device according to Embodiment 2.

FIG. 5 is a circuit configuration diagram of an output buffer circuit and a circuit device according to Embodiment 2, and corresponds to FIG. 4. It should be noted that the same regions as in the configuration shown in FIG. 4 are denoted by the same reference symbols, and redundant descriptions will be omitted.

The control circuit 4 shown in FIG. 5 is attached with a storage circuit 70. Except this point, FIG. 5 is the same as FIG. 4 including the configuration of the output buffer circuit 1.

The storage circuit 70 stores resistor switching information. The resistor switching information means information for determining the resistance value of the variable resistance circuit 30, and the control circuit 4 outputs the control signals SPb, SPc based on the resistor switching information to thereby control ON/OFF of the switches 31b, 31c. It should be noted that the storage circuit is configured including a nonvolatile memory such as a ROM (Read Only Memory), and stores the resistor switching information in advance.

According to the present embodiment, the following advantages can be obtained in addition to the advantages in Embodiment 1.

The control circuit 4 is attached with the storage circuit 70 for storing the resistor switching information. The control circuit 4 controls the ON/OFF of the switches 31b, 31c based on the resistor switching information.

Therefore, it is possible to provide the output buffer circuit 1 and the circuit device 81 with which the signal having the desired waveform can be obtained from the beginning of the output including the adjustment of the combined resistance value in the variable resistance circuit 30.

* Different Aspect-2 of Output Buffer Circuit *

Embodiment 3

Figure 6:
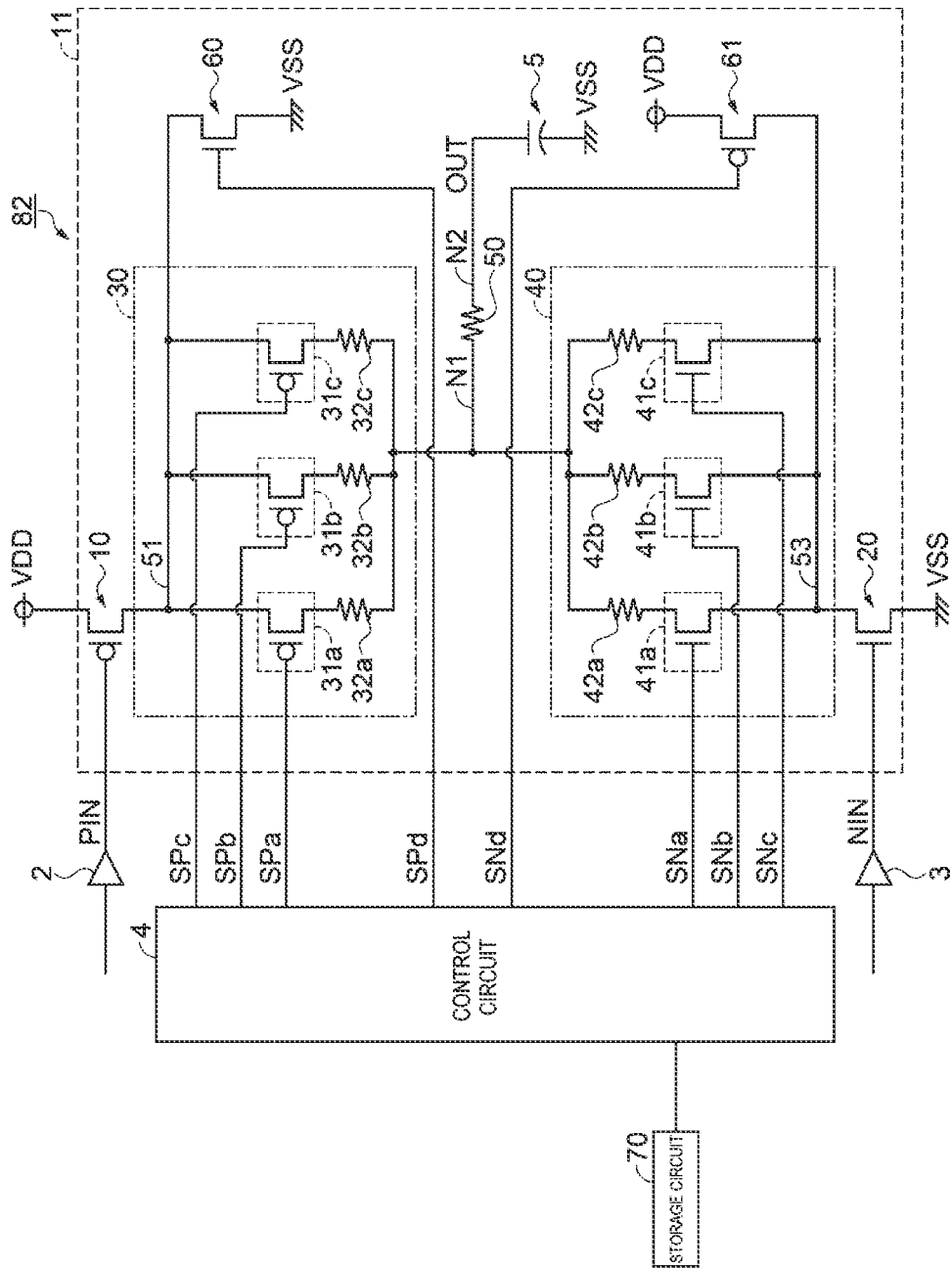
FIG. 6 is a circuit diagram of an output buffer circuit and a circuit device according to Embodiment 3.

FIG. 6 is a circuit configuration diagram of an output buffer circuit and a circuit device according to Embodiment 3, and corresponds to FIG. 5. It should be noted that the same regions as in the configuration shown in FIG. 5 are denoted by the same reference symbols, and redundant descriptions will be omitted.

A circuit device 82 according to the present embodiment shown in FIG. 6 is provided with an output buffer circuit 11.

The output buffer circuit 11 has a configuration obtained by adding a P-type switch 61 as a fourth switch to the configuration of the output buffer circuit 1 shown in FIG. 5. Further, the control circuit 4 is added with a function of performing ON/OFF control of the P-type switch 61. The configuration is the same as the configuration shown in FIG. 5 except these points.

The P-type switch 61 is a circuit added for removing generation of the unwanted noise 52 when starting the output shown in FIG. 3 which is generated in the related-art output buffer circuit.

In the P-type switch 61, the drain is coupled to the node 53, the source is supplied with the power supply voltage VDD as a voltage of a first power supply voltage node, and the gate is supplied with a control signal SNd from the control circuit 4. When the output signal OUT in the output node N2 is in the halt state, the control signal SNd at the low level is input to the gate of the P-type switch 61 from the control circuit 4, and the node 53 at the drain side and the power supply voltage at the source side become in the conductive state. This is for fixing the voltage of the node 53, which is in the electrically floating state in the related-art circuit, to the power supply voltage VDD to thereby prevent the node 53 from being set at a halfway potential different from the power supply voltage VDD in the halt state of the output signal OUT. When the node 53 is not set at a halfway potential, there is no chance for the unwanted noise to be output when starting the output, and it is possible to obtain the desired clean output waveform. Further, in the state in which the output signal OUT is kept output in the output node N2, since the control signal SNd at the high level is input to the gate of the P-type switch 61 from the control circuit 4, and the node 53 at the drain side and the power supply voltage at the source side become in the nonconductive state, there is no possibility that the output of the output signal OUT in the steady state is hindered.

The storage circuit 70 also stores resistor switching information corresponding to the variable resistance circuit 40 in addition to the resistor switching information for the variable resistance circuit 30. The control circuit 4 outputs the control signals SNb, SNc to the switches 41b, 41c based on the resistor switching information to thereby control the ON/OFF of the switches 41b, 41c.

As described hereinabove, according to the output buffer circuit 11 and the circuit device 82 related to the present embodiment, the following advantages can be obtained in addition to the advantages in the embodiments described above.

The output buffer circuit 11 is further provided with the P-type switch 61 coupled between the drain of the N-type transistor 20 and the power supply voltage VDD.

Further, when the clock signal is not output from the output node N2, the control circuit 4 controls all of the switches 41a, 41b, and 41c to make OFF, and at the same time, controls the P-type switch 61 to make ON. When the clock signal is output from the output node N2, the control circuit 4 performs control of making the switch 41a ON, and at the same time, making the P-type switch 61 OFF. Thus, unlike the related-art output buffer circuit, it is possible to release the charge retained at the node 53 when halting the output, and thus, output the signal having the clean waveform from the beginning of the output.

Therefore, it is possible to provide the output buffer circuit 11 and the circuit device 82 with which the signal having the desired waveform can be obtained from the beginning of the output.

Further, the storage circuit 70 stores the resistor switching information for the variable resistance circuit 40. The control circuit 4 controls the ON/OFF of the switches 41b, 41c based on the resistor switching information.

Therefore, it is possible to provide the output buffer circuit 11 with which the signal having the desired waveform can be obtained from the beginning of the output including the adjustment of the combined resistance value in the variable resistance circuit 40.

It should be noted that when the clock signal is output from the output node N2, it is sufficient to make at least one of the switches 41a, 41b, and 41c ON in accordance with the set resistance value.

Further, when the clock signal from the output node N2 is halted, there is no chance for the N-type switch 60 and the P-type switch 61 to make ON at the same time, and the control circuit 4 determines which one of the N-type switch and the P-type switch 61 is selectively made ON in accordance with the output circuit. In a preferred example, when the output signal OUT is based on the ground voltage as in the output waveform shown in FIG. 3, the N-type switch 60 is selectively made ON. Further, when the output signal OUT is based on the power supply voltage VDD, the P-type switch 61 is selectively made ON.

It should be noted that the resistance values of the resistors 32a, 32b, and 32c included in the variable resistance circuit 30 can be 0Ω. Similarly, the resistance values of the resistors 42a, 42b, and 42c included in the variable resistance circuit 40 can be 0Ω. Even when these resistance values are 0Ω, it is possible for the variable resistance circuits 30 and 40 to achieve the function as the variable resistance since the switches 31a, 31b, and 31c and the switches 41a, 41b, and 41c each have an ON resistance. Further, when setting the resistance values to 0Ω, there can be cited an advantage that it is possible to reduce the size of the circuit scale since the resistors become unnecessary.

Further, although in the above, the first power supply voltage node is set at the power supply voltage VDD as the voltage of a high-potential side power supply voltage node, and the second power supply voltage node is set at the ground voltage VSS as the voltage of a low-potential side power supply voltage node, it is also possible to set the first power supply voltage node at the ground voltage VSS and set the second power supply voltage node at the power supply voltage VDD.

It should be noted that when setting the first power supply voltage node at the ground voltage VSS, and setting the second power supply voltage node at the power supply voltage VDD, it is sufficient to counterchange the conductivity types of all of the transistors including the P-type transistor 10, the N-type transistor 20, the N-type switch 60, and the P-type switch 61. In particular, it is sufficient to counterchange the conductivity types, namely the P type and the N type, of all of the transistors in the P-type transistor 10, the N-type transistor 20, the N-type switch 60, the P-type switch 61, the switches 31a, 31b, and 31c each formed of the P-type transistor, and the switches 41a, 41b, and 41c each formed of the N-type transistor.

* Oscillator *

Embodiment 4

Figure 7:
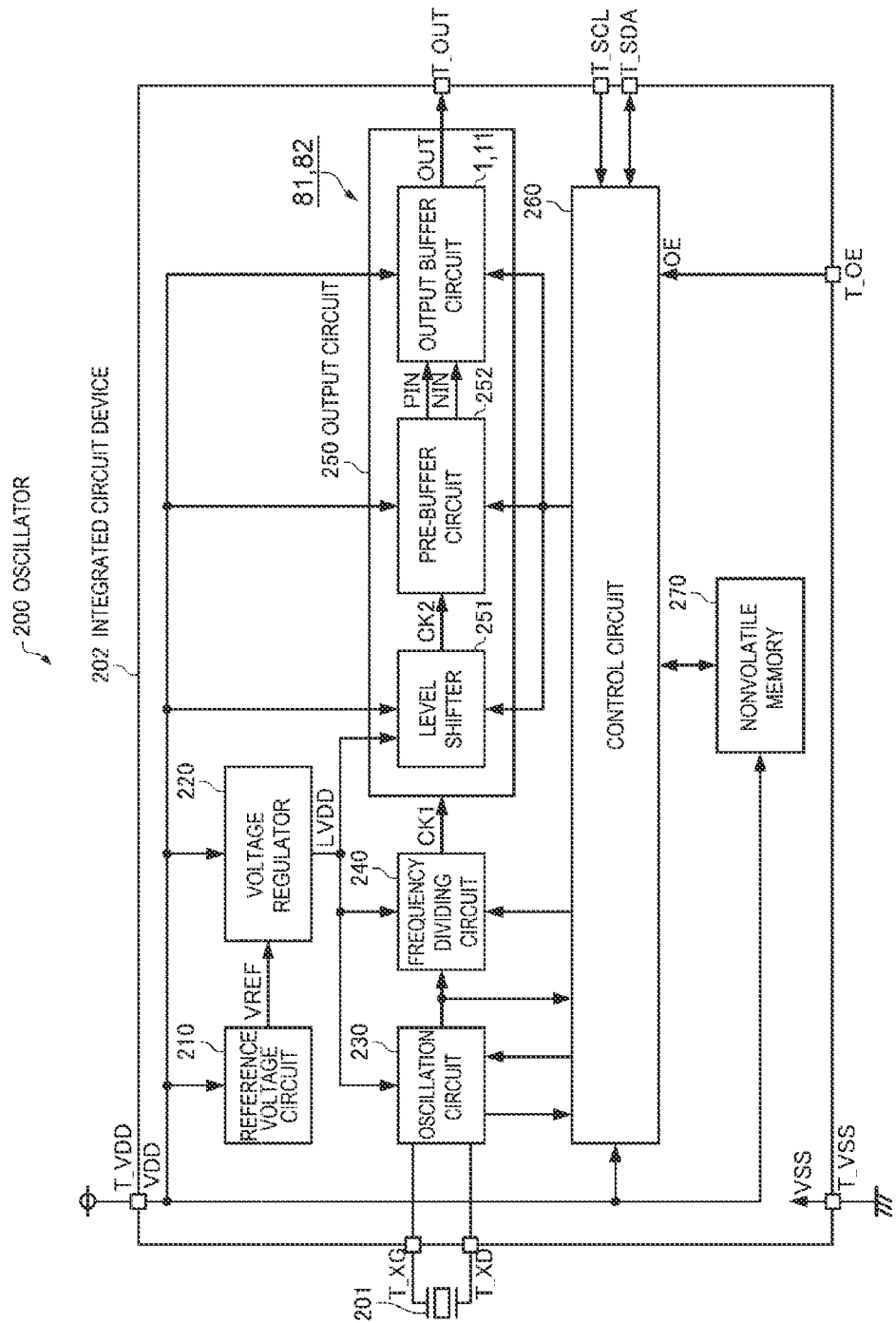
FIG. 7 is a circuit block diagram of an oscillator according to Embodiment 4.

FIG. 7 is a functional block configuration diagram of an oscillator.

The oscillator 200 according to the present embodiment is provided with the output buffer circuit 11 and the circuit device 82 described above. It should be noted that it is possible to be provided with the output buffer circuit 1 and the circuit device 81 instead of the output buffer circuit 11 and the circuit device 82.

The oscillator 200 is constituted by a resonator 201, an integrated circuit device 202, and so on.

As the resonator 201, there is adopted a quartz crystal resonator as a preferred example. It should be noted that the quartz crystal resonator is not a limitation, and it is possible to use an SAW (Surface Acoustic Wave) resonator element, a piezoelectric resonator element, an MEMS (Micro Electro Mechanical Systems) resonator, and so on.

The integrated circuit device 202 is configured as a single chip integrated circuit (IC), and is provided with a T_XG terminal, a T_XD terminal, a T_SCL terminal, a T_SDA terminal, a T_OE terminal, a T_VDD terminal, a T_VSS terminal, and a T_OUT terminal.

The integrated circuit device 202 includes a reference voltage circuit 210, a voltage regulator 220, an oscillation circuit 230, a frequency dividing circuit 240, an output circuit 250, a control circuit 260, and a nonvolatile memory 270. It should be noted that the integrated circuit device 202 can be provided with a configuration obtained by omitting or modifying some of these constituents, or adding other constituents.

Each of the circuits in the integrated circuit device 202 operates based on the ground voltage VSS (e.g., 0 V) supplied via the T_VSS terminal.

The reference voltage circuit 210 generates a reference voltage VREF from the power supply voltage VDD supplied via the T_VDD terminal, and then outputs the reference voltage VREF to the voltage regulator 220. For example, the reference voltage circuit 210 is realized by a band-gap reference circuit using the band gap of a semiconductor, or the like.

The voltage regulator 220 generates a power supply voltage LVDD based on the power supply voltage VDD and the reference voltage VREF. The voltage generated by the voltage regulator 220 is used as a power supply voltage for the oscillation circuit 230 and the frequency dividing circuit 240.

The oscillation circuit 230 is coupled to one end of the resonator 201 via the T_XG terminal, and is coupled to the other terminal of the resonator 201 via the T_XD terminal. The oscillation circuit 230 amplifies an output signal of the resonator 201 input via the T_XG terminal, and feeds back the signal obtained by amplifying the output signal of the resonator 201 to the resonator 201 via the T_XD terminal to thereby oscillate the resonator 201. The oscillation circuit 230 can be provided with a temperature compensation function or a frequency conversion function. For example, the oscillation circuit 230 can perform a frequency conversion on a signal which is obtained by amplifying the output signal of the resonator 201 in accordance with a division ratio corresponding to a control signal from the control circuit 260 using a fractional-N PLL circuit, and then output the result. The oscillation circuit 230 outputs an oscillation signal on which a signal to be input to the output buffer circuit 11 described later is based. An operation of the oscillation circuit 230 is controlled based on the control signal from the control circuit 260.

The frequency dividing circuit 240 outputs a clock signal CK1 obtained by dividing the frequency of the oscillation signal output from the oscillation circuit 230 with a division ratio corresponding to the control signal from the control circuit 260. An amplitude of the clock signal CK1 is substantially equal to a difference between the power supply voltage LVDD and the ground voltage VSS.

The output circuit 250 is configured including a level shifter 251, a pre-buffer circuit 252, and an output buffer circuit 11 described above.

The level shifter 251 outputs a clock signal CK2 obtained by converting the clock signal CK1 so that the amplitude thereof becomes substantially equal to the difference between the power supply voltage VDD and the ground voltage VSS.

An operation of the level shifter 251 is controlled based on the control signal from the control circuit 260.

The pre-buffer circuit 252 operates with the power supply voltage VDD, and generates input signals PIN, NIN for the output buffer circuit 11 based on the clock signal CK2. It should be noted that although not shown in the drawing, the pre-buffer circuit 252 is configured including the pre-buffer circuits 2, 3 shown in FIG. 6. The pre-buffer circuits 2, 3 shown in FIGS. 1, 4, and 5 are also included in the pre-buffer circuit 252 in a similar manner. For example, the pre-buffer circuit 252 outputs the input signals PIN, NIN both at the low level when the clock signal CK2 is at the high level, and outputs the input signals PIN, NIN both at the high level when the clock signal CK2 is at the low level. An operation of the pre-buffer circuit 252 is controlled based on the control signal from the control circuit 260.

As described above, the output buffer circuit 11 operates with the power supply voltage VDD to generate the output signal OUT based on the input signals PIN, NIN. The rising time and the falling time of the output signal OUT vary based on the control signal from the control circuit 260. The output signal OUT is output to the outside of the oscillator 200 from the T_OUT terminal.

The control circuit 260 has an interface circuit (not shown) compatible with the I²C (Inter-Integrated Circuit) bus, receives a serial data signal input via the T_SDA terminal in sync with a serial clock signal input via the T_SCL terminal from an external device not shown, and then stores a variety of types of data in the nonvolatile memory 270 in accordance with the serial data thus received. Further, the control circuit 260 generates a variety of control signals based on the variety of types of data stored in the nonvolatile memory 270. It should be noted that the control circuit 260 corresponds to the control circuit 4 shown in FIG. 6. Similarly, the control circuit 4 shown in FIGS. 1, 4, and 5 can also be replaced with the control circuit 260. Further, the nonvolatile memory 270 corresponds to the storage circuit 70 shown in FIG. 6. Similarly, the storage circuit 70 shown in FIG. 5 can also be replaced with the nonvolatile memory 270.

When an output enable signal OE input via the T_OE terminal from the external device not shown is at the high level, the control circuit 260 operates the level shifter 251, and at the same time, controls the pre-buffer circuit 252 to output the input signals PIN, NIN corresponding to the clock signal CK2. Further, when the output enable signal OE is at the low level, the control circuit 260 stops the level shifter 251, and at the same time, controls the pre-buffer circuit 252 to output the input signal PIN at the high level and the input signal NIN at the low level.

When the input signal PIN is at the high level, and the input signal NIN is at the low level, a P-type transistor and an N-type transistor not shown in the output buffer circuit 1, 11 both make OFF, and the T_OUT terminal becomes in the high-impedance state.

It should be noted that the interface circuit provided to the control circuit 260 is not limited to the interface circuit compatible with the I²C bus, but can also be an interface circuit compatible with, for example, the SPI (Serial Peripheral Interface) bus.

As described hereinabove, according to the oscillator 200 related to the present embodiment, by applying the output buffer circuit 11 and the circuit device 82, the adjustment of the drive capacity of the pre-buffer circuit 252 becomes unnecessary, and thus, it is possible to output the signal having a clean waveform form the beginning of the output while it is easy to adjust the rising time and the falling time of the output signal OUT. It should be noted that when applying the output buffer circuit 1 and the circuit device 81, substantially the same functions and advantages can be obtained.

Embodiment 5

* Electronic Apparatus *

Figure 8:
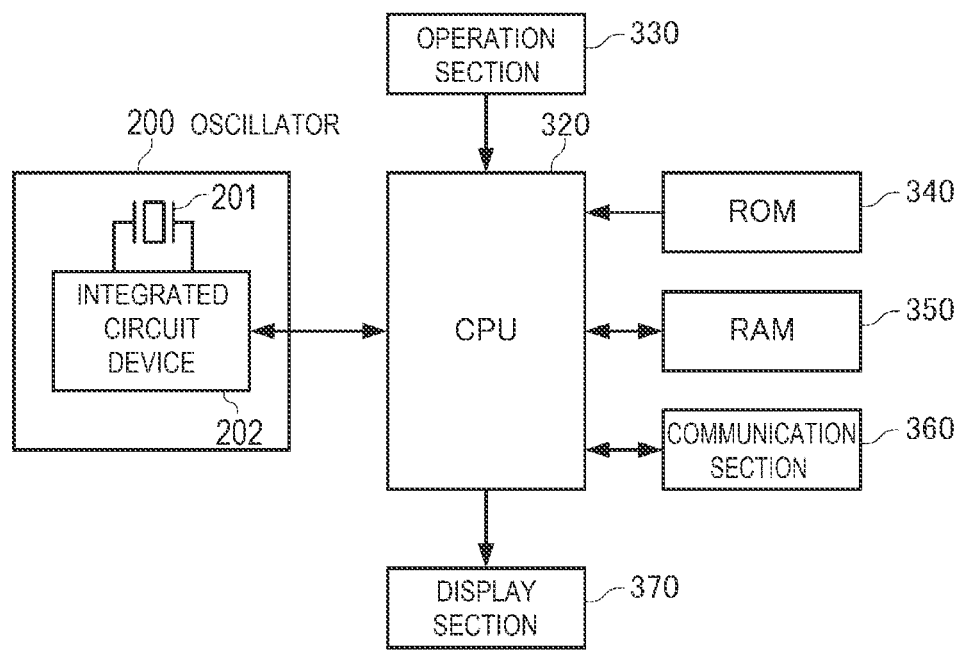
FIG. 8 is a circuit block diagram of a smartphone according to Embodiment 5.
Figure 9:
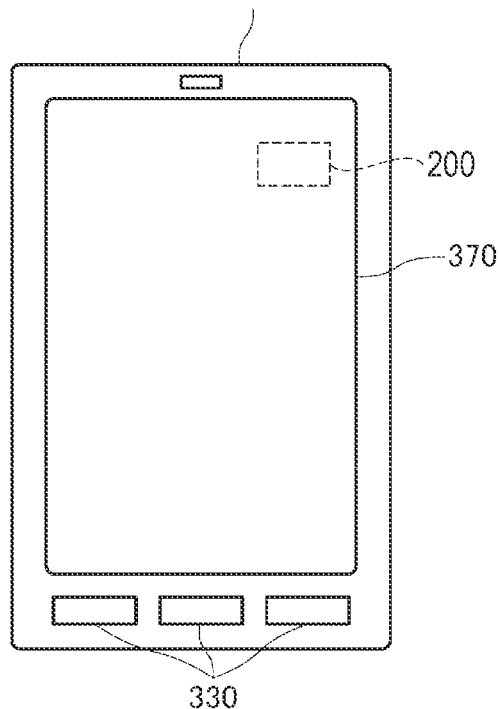
FIG. 9 is an appearance diagram of the smartphone.

FIG. 8 is a functional block diagram of an electronic apparatus according to the present embodiment. FIG. 9 is an appearance diagram of a smartphone as an example of the electronic apparatus.

The smartphone 300 as the electronic apparatus according to the present embodiment is configured including an oscillator 200 described above, a CPU (Central Processing Unit) 320, an operation section 330, a ROM (Read Only Memory) 340, a RAM (Random Access Memory) 350, a communication section 360, and a display section 370. It should be noted that the smartphone 300 can also have a configuration obtained by eliminating or modifying some of the constituents (the sections) shown in FIG. 8, or adding other constituents.

The oscillator 200 is provided with the resonator 201 and the integrated circuit device 202. The integrated circuit device 202 oscillates the resonator 201 to generate an oscillation signal. The oscillation signal is output from an external terminal of the oscillator 200 to the CPU 320. The integrated circuit device 202 outputs an output signal generated inside based on the oscillation signal output from the resonator 201 from the output buffer circuit 1, 11 described above.

The CPU 320 is a processing section for performing a variety of types of arithmetic processing and control processing using the signal output from the oscillator 200 as a clock signal in accordance with a program stored in the ROM 340 and so on. Specifically, the CPU 320 performs a variety of types of processing corresponding to an operation signal from the operation section 330, processing of controlling the communication section 360 for performing data communication with the external device, processing of transmitting a display signal for making the display section 370 display a variety of types of information, and so on.

The operation section 330 is an input device constituted by operation keys, button switches, and so on, and outputs the operation signal corresponding to the operation by the user to the CPU 320. It should be noted that the display section 370 of the smartphone 300 shown in FIG. 9 is provided with a touch panel, and also functions as the operation section 330.

The ROM 340 is a storage section for storing the programs, data, and so on for the CPU 320 to perform the variety of types of arithmetic processing and control processing.

The RAM 350 is a storage section which is used as a working area of the CPU 320, and temporarily stores the programs and the data retrieved from the ROM 340, the data input from the operation section 330, the calculation result obtained by the CPU 320 performing operations in accordance with the variety of types of programs, and so on.

The communication section 360 performs a variety of types of control for achieving the data communication between the CPU 320 and the external device.

The display section 370 is a display device formed of an LCD (Liquid Crystal Display) or the like, and displays a variety of types of information based on a display signal input from the CPU 320.

As described hereinabove, the smartphone 300 according to the present embodiment is provided with the oscillator 200 with which a signal having a desired waveform can be obtained from the beginning of the output.

Therefore, it is possible to provide the smartphone 300 stable in operation.

It should be noted that the smartphone 300 is not a limitation, and it is possible to apply the oscillator 200 described above to a variety of electronic apparatuses.

As the electronic apparatus, there can be cited, for example, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a mobile communication base station apparatus, a television set, a video camera, a video recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a PDR (Pedestrian Dead Reckoning) system. It is possible for even these electronic apparatuses to perform a stable operation by being provided with the oscillator 200 with which a signal having a desired waveform can be obtained from the beginning of the output.

Embodiment 6

* Vehicle *

Figure 10:
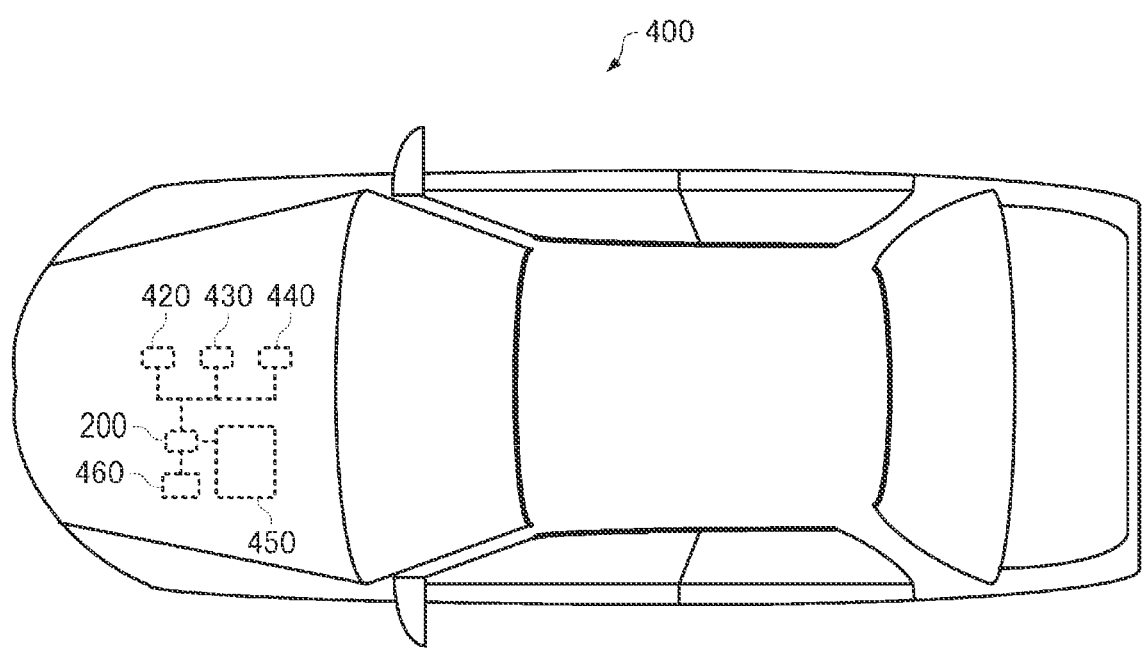
FIG. 10 is a plan view of a vehicle according to Embodiment 6.

FIG. 10 is a plan view showing an example of a vehicle according to the present embodiment.

The vehicle 400 shown in FIG. 10 is a car, and is configured including the oscillator 200, controllers 420, 430, and 440 for performing a variety of types of control such as an engine system, a brake system, or a keyless entry system, a battery 450, and a backup battery 460. It should be noted that the vehicle according to the present embodiment can be provided with a configuration obtained by omitting some of the constituents shown in FIG. 10, or adding other constituents.

The oscillator 200 is provided with the integrated circuit device 202 and the resonator 201 shown in FIG. 7, and the integrated circuit device 202 oscillates the resonator 201 to generate the oscillation signal. The integrated circuit device 202 outputs an output signal generated inside based on the oscillation signal output from the resonator 201 from the output buffer circuit 1, 11 described above. The output signal is supplied from the external terminal of the oscillator 200 to the controllers 420, 430, and 440, and is used as, for example, a clock signal.

The battery 450 supplies the oscillator 200 and the controllers 420, 430, and 440 with electrical power. The backup battery 460 supplies the oscillator 200 and the controllers 420, 430, and 440 with the electrical power when the output voltage of the battery 450 drops to a level lower than a threshold value.

As described hereinabove, the vehicle 400 according to the present embodiment is provided with the oscillator 200 with which a signal having a desired waveform can be obtained from the beginning of the output.

Therefore, it is possible to accurately perform a variety of types of control in the vehicle 400.

It should be noted that the car is not a limitation, and it is possible to apply the oscillator 200 described above to a variety of vehicles. As the vehicle 400, there can be cited, for example, a motorcycle, a mobility scooter, an aircraft such a jet plane or a helicopter, a ship, a boat, a rocket, and an artificial satellite.

What is claimed is:

1. A circuit device comprising:
    an output buffer circuit which is coupled between a first power supply voltage node and a second power supply voltage node, and which is configured to output a clock signal from an output node; and
    a control circuit configured to control an operation of the output buffer circuit, wherein
    the output buffer circuit includes
        a first MOS transistor of a first conductivity type a source of which is coupled to the first power supply voltage node,
        a second MOS transistor of a second conductivity type a source of which is coupled to the second power supply voltage node,
        a first variable resistance circuit which is coupled between a drain of the first MOS transistor and the output node, and which includes a first switch, and
        a second switch coupled between the drain of the first MOS transistor and the second power supply voltage node, and
    the control circuit performs control of
        making the first switch OFF and making the second switch ON when the clock signal fails to be output from the output node, and
        making the first switch ON and making the second switch OFF when the clock signal is output from the output node.

2. The circuit device according to claim 1, wherein the output buffer circuit further includes
    a second variable resistance circuit which is coupled between a drain of the second MOS transistor and the output node, and which includes a third switch, and
    a fourth switch coupled between the drain of the second MOS transistor and the first power supply voltage node, and
    the control circuit performs control of
        making the third switch OFF and making the fourth switch ON when the clock signal fails to be output from the output node, and
        making the third switch ON and making the fourth switch OFF when the clock signal is output from the output node.

3. The circuit device according to claim 1, further comprising:
    a storage circuit configured to store resistor switching information, wherein
    the first variable resistance circuit further includes
        a first resistor coupled in series to the first switch,
        a fifth switch coupled in parallel to the first switch, and
        a second resistor coupled in series to the fifth switch, and
    the control circuit controls ON/OFF of the fifth switch based on the resistor switching information.

4. The circuit device according to claim 2, further comprising:
    a storage circuit configured to store resistor switching information, wherein
    the second variable resistance circuit further includes
        a third resistor coupled in series to the third switch,
        a sixth switch coupled in parallel to the third switch, and
        a fourth resistor coupled in series to the sixth switch, and
    the control circuit controls ON/OFF of the sixth switch based on the resistor switching information.

5. The circuit device according to claim 2, wherein the control circuit selectively makes one of the second switch and the fourth switch ON in accordance with a reference potential of the clock signal.

6. The circuit device according to claim 1, wherein
    the first power supply voltage node is a high-potential side power supply voltage node,
    the second power supply voltage node is a low-potential side power supply voltage node,
    the first conductivity type is a P type, and
    the second conductivity type is an N type.

7. The circuit device according to claim 1, wherein
    the first power supply voltage node is a low-potential side power supply voltage node,
    the second power supply voltage node is a high-potential side power supply voltage node,
    the first conductivity type is an N type, and
    the second conductivity type is a P type.

8. An oscillator comprising:
    the circuit device according to claim 1; and
    a resonator configured to generate an oscillation signal, wherein
    the circuit device outputs a clock signal based on the oscillation signal.

9. An electronic apparatus comprising:
    the oscillator according to claim 8.

10. A vehicle comprising:
    the oscillator according to claim 8.

* * * * *